United States Patent
Setta

(10) Patent No.: US 7,723,230 B2
(45) Date of Patent: May 25, 2010

(54) METHOD FOR MANUFACTURING SEMICONDUCTOR DEVICE AND METHOD FOR DESIGNING PHOTOMASK PATTERN

(75) Inventor: Yuji Setta, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 12/212,052

(22) Filed: Sep. 17, 2008

(65) Prior Publication Data

US 2009/0081882 A1    Mar. 26, 2009

(30) Foreign Application Priority Data

Sep. 20, 2007   (JP) .............................. 2007-244266

(51) Int. Cl.
*H01L 21/44* (2006.01)

(52) U.S. Cl. ............................... 438/671; 257/E21.232

(58) Field of Classification Search ................ 438/671; 257/E21.232

See application file for complete search history.

(56) References Cited

U.S. PATENT DOCUMENTS 6,938,238 B2 *  8/2005  Okagawa et al. .............. 716/19

FOREIGN PATENT DOCUMENTS

JP    2004103999 A    4/2004

* cited by examiner

*Primary Examiner*—Alexander G Ghyka
*Assistant Examiner*—Seahvosh J Nikmanesh
(74) *Attorney, Agent, or Firm*—Westerman, Hattori, Daniels & Adrian, LLP

(57) ABSTRACT

A method for designing a photomask pattern is provided. First, all line ends of object patterns are determined with reference to layout data. Then, object patterns, front edge portions, and joints, which are aligned on the same line extending along the Y-axis, are connected to form first reticle data. Reticle pattern data having data representing binding portions serving as light blocking portions is formed. The front edge portions being adjacent to each other and aligned in the X-axis are connected and adjacent joints being aligned in the same manner as the front edge portions are also connected to form second reticle data. Then, portions are provided at central regions between the binding portions so as to connect the adjacent binding portions including the front edge portions and the joints. Then, reticle data having data representing the binding portions serving as transparent patterns is formed.

7 Claims, 16 Drawing Sheets

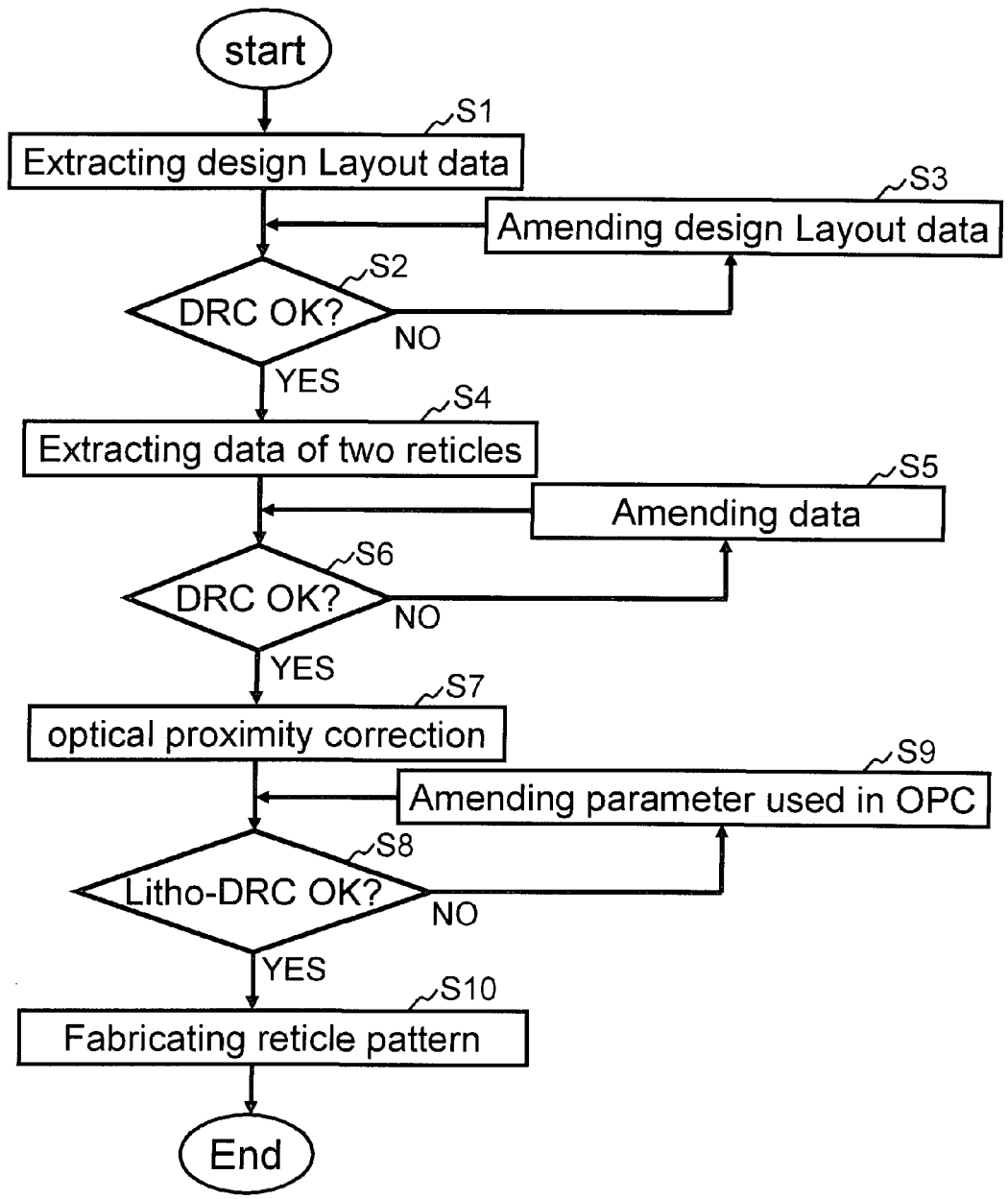

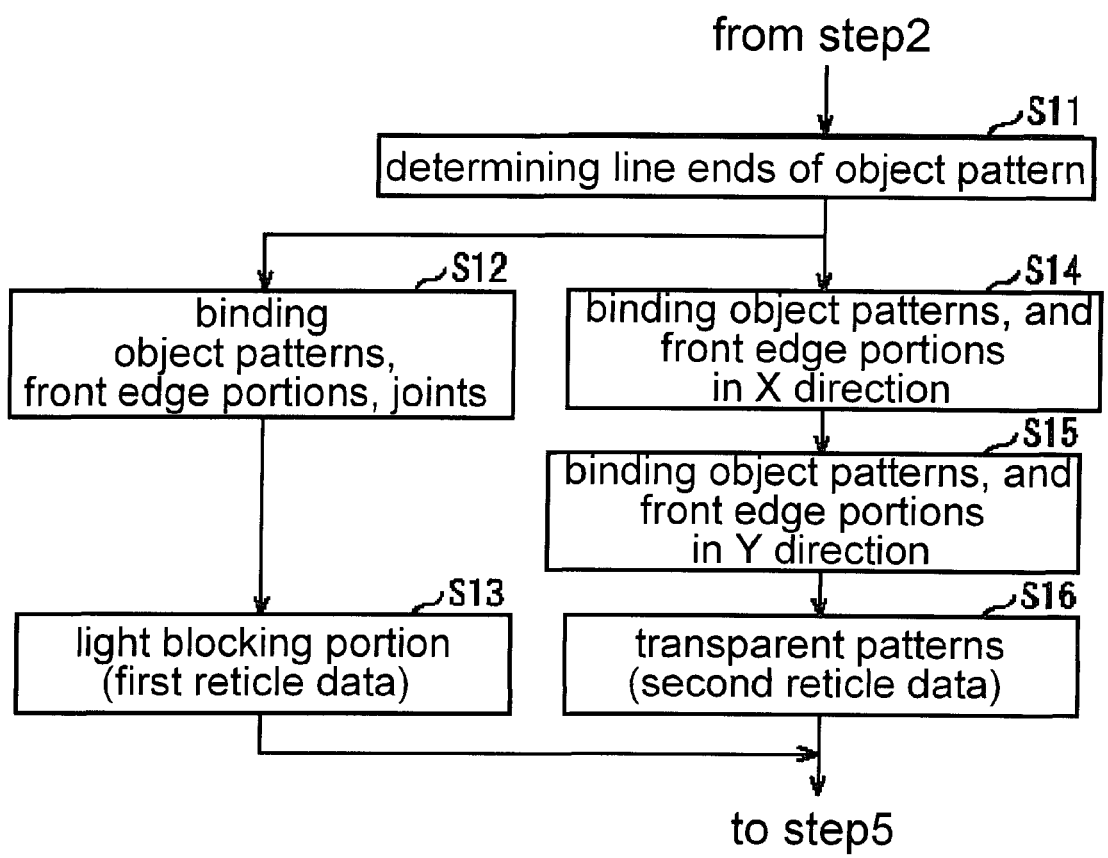

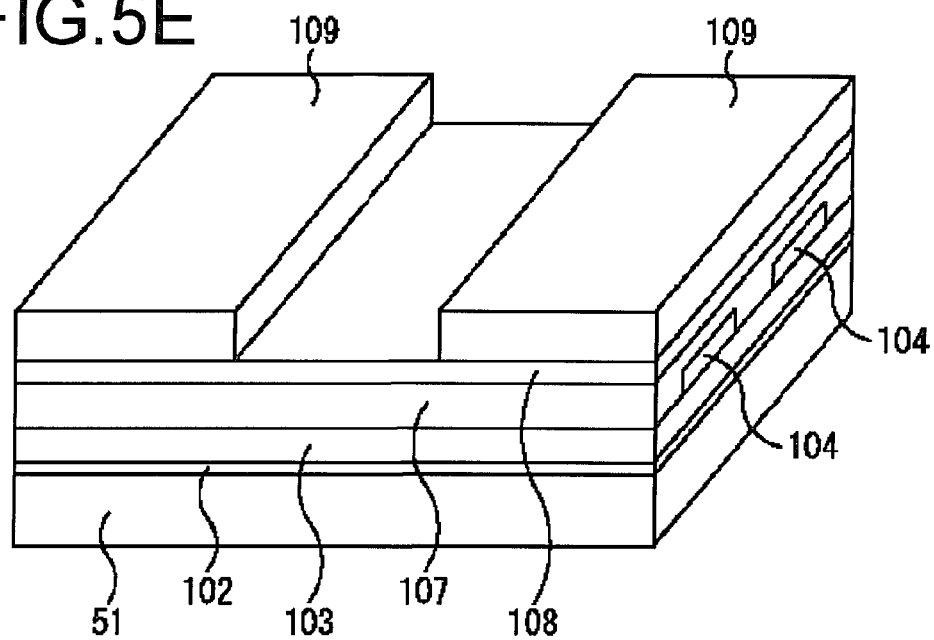
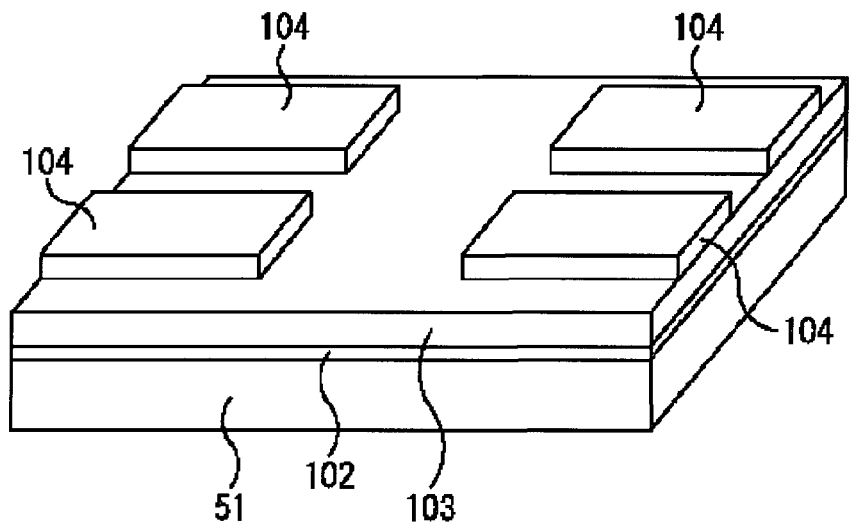

METHOD FOR MANUFACTURING SEMICONDUCTOR DEVICE AND METHOD FOR DESIGNING PHOTOMASK PATTERN

CROSS REFERENCE TO RELATED APPLICATION

This application is based upon and claims the benefit of priority from the prior Japanese Patent Application NO. 2007-244266 filed on Sep. 20, 2007, the entire contents of which are incorporated herein by reference.

BACKGROUND

1. Field

The embodiments discussed herein are related to a method for manufacturing semiconductor devices which facilitate miniaturization, and a method for designing photomask patterns.

2. Description of the Related Art

In line with the requirement for miniaturization of semiconductor devices, recently the width of gate electrodes and the like has also been required to be smaller than a wavelength of exposure light used in patterning and positive-type resists have been mainly used in such an exposing step. However, for features smaller than the wavelength of the exposure light, proximity effects considerably appear when a resist pattern is formed and may result in differences between a pattern of a reticle and a pattern of a resist transferred from the reticle. Accordingly, a technique for compensating for the differences is applied, in which serifs on line ends of a reticle pattern, which are called hammer-heads, are provided in order to form a desired resist pattern.

To reduce the proximity effects, optical proximity correction (OPC) has been used, and this technique can be used to suppress variation of linewidth of patterns. However, the technique cannot also improve resolution. Therefore, to enhance the resolution, techniques of super-resolution are occasionally applied. Examples of super-resolution techniques include a technique using a phase-shift mask such as a Levenson-type mask and a technique using oblique illumination such as zone plate illumination.

However, in a case in which two conductive line ends face each other or a line end faces the side of another line, there may be difficulties in using such super-resolution techniques to form a resist pattern, which is designed to have fine features as small as the wavelength of exposure light, with a sufficient lithography margin. As a result, short circuits may occur at gate electrodes and the like. For currently manufactured TEGs that include several billion minute transistors, short circuits are a serious problem even if a short circuit occurs in only one transistor among several billion transistors.

Japanese Laid-open Patent Publication No. 2004-103999 discloses a technique in which two exposing steps for patterning gate electrodes to be a desired shape are performed. These two steps are performed with different reticles under different optical conditions. However, if this technique is applied, a lithography margin, which is needed in at least one exposing step, may be undesirably reduced and defects may easily occur in a developing step, which may lead to short circuiting of the pattern.

SUMMARY OF THE INVENTION

According to one aspect of embodiments, a method for manufacturing a semiconductor device includes:

forming a mask layer over a target film;
forming a first photoresist film over the mask layer;
patterning the first photoresist film using a first photomask;
patterning the mask layer using the resulting first photoresist film as a mask;
removing the first photoresist film;
forming a second photoresist film over the mask layer;
patterning the second photoresist film using a second photomask;
patterning the mask layer using the resulting second photoresist film as a mask;
removing the second photoresist film; and
patterning the target film using the mask layer, wherein
the first photomask has a binding pattern binding at least two retained portions, which are retained separate from each other with respect to layout data representing an original pattern of the target film (hereinafter a retained portion is referred to as a "target pattern"),
the second photomask has a separation pattern overlapping the binding pattern and separating the target patterns formed in one body in the first photomask. Here, an area of the separation pattern is equal to or larger than a predetermined threshold value.

BRIEF DESCRIPTION OF THE DRAWINGS

FIG. 1 is a flowchart showing a method for designing a reticle pattern used for manufacturing semiconductor devices of a first embodiment;

FIG. 2 is a flowchart showing a process performed in step S4 of the first embodiment;

FIG. 5E is a schematic perspective view of gate electrodes on gate insulating films in a step following the step shown in FIG. 5D;

FIG. 5F is a schematic perspective view of gate electrodes on gate insulating films in a step following the step shown in FIG. 5E;

DESCRIPTION OF THE PREFERRED EMBODIMENTS

An embodiment is specifically described below with reference to attached drawings.

A first embodiment is now described. The present embodiment facilitates manufacturing of a semiconductor device, such as a static random access memory (SRAM) cell, which includes repeated patterns of gate electrodes and the like. FIG. 1 is a flowchart showing a method for designing a reticle pattern used for manufacturing semiconductor devices of a first embodiment.

Figure 3A:
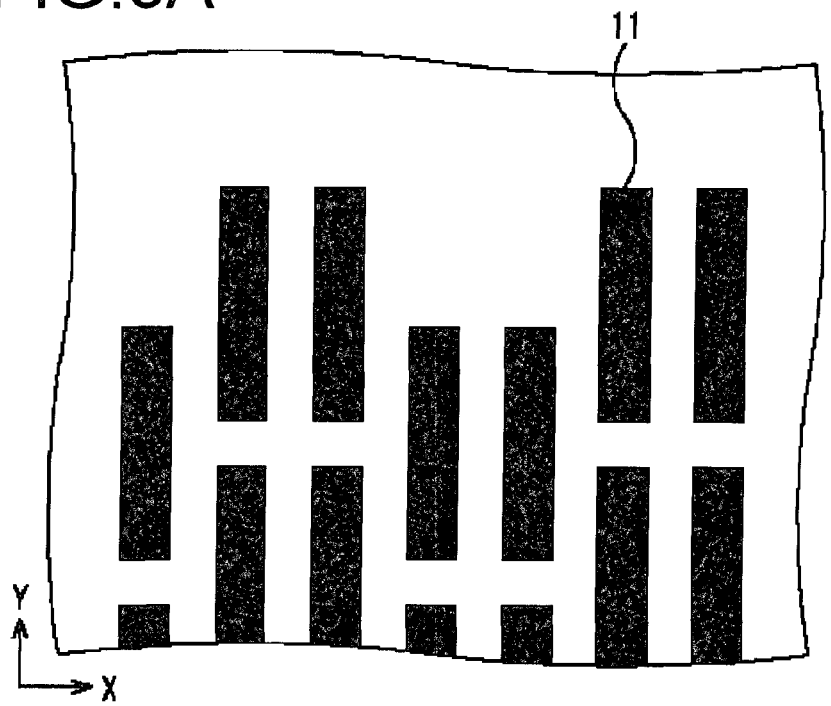
FIG. 3A is a schematic view of layout data used in the first embodiment.

First, layout data of object patterns such as gate electrodes is extracted from design data of a semiconductor device to be fabricated (step S1). In the present embodiment, as shown in FIG. 3A, the layout data of a plurality of gate patterns 11 having line ends facing each other is obtained. Here, the distance between the gate patterns 11 is, for example, 60 nm or less.

Then, the layout data is checked with respect to a design rule (DRC: Design Rule Check) (step S2).

If the layout date includes any undesired data, the data is amended (step S3) and the resulting layout data is checked again (step S2).

If the layout corresponds to the desired pattern, two sets of data of two reticles (photomasks) are individually extracted from the layout data (step S4). The method for extracting data will be described below in detail.

The layout data of the reticles is checked with respect to a design rule (DRC: Design Rule Check) (step S5). At this stage, for example, the width of a margin provided in preparation for lithography is examined.

If the width of a lithography margin is smaller than the desired one, the data of the reticles is amended (step S6) and the resulting layout data is checked again (step S5).

If the reticle data corresponds to the desired data, the reticle data is amended through OPC (step S7).

Then, the data after OPC is checked with respect to a design rule (DRC: Design Rule Check) (step S8). At this stage, again, for example, the width of a margin provided in preparation for lithography is examined.

If the width of a lithography margin is smaller than the desired one, a parameter used in OPC is amended (step S9) and the resulting layout data is checked again (step S8).

If the data after OPC corresponds to the desired data, two different reticle patterns are designed with reference to the data, so that the two different reticles can be fabricated.

Next, a process performed in step S4 will be described in detail. FIG. 2 is a flowchart showing a process performed in step S4 of the first embodiment.

Figure 3B:
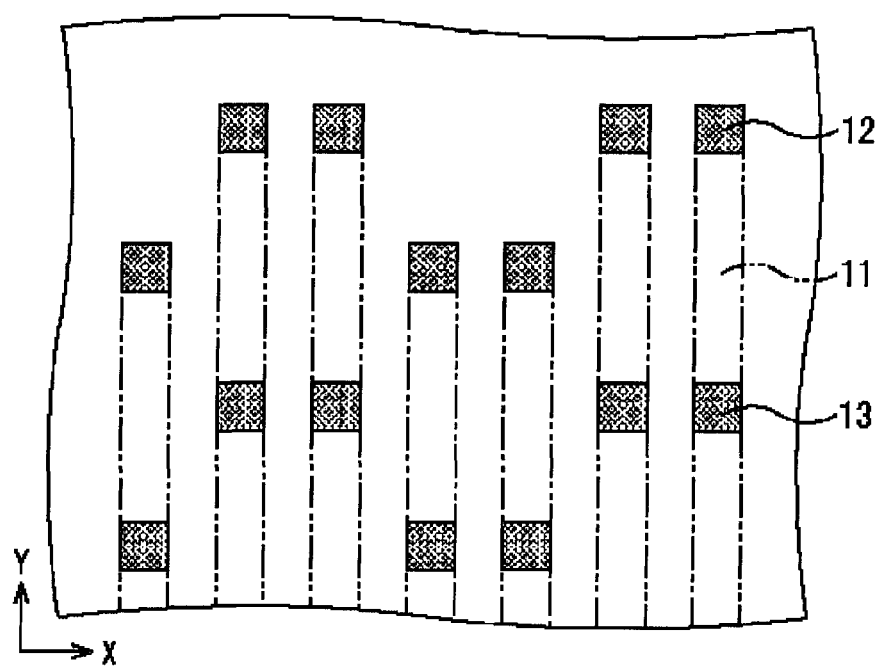
FIG. 3B is a schematic view showing a process of step S11 of the first embodiment.

First, all line ends of object patterns are determined with reference to the layout data obtained in step S1 (step S11). Before the determination, an X-axis (second direction) and a Y-axis (first direction), which cross at right angles to each other, should be defined in a plane in which the object patterns are to be formed. Then, line ends of a pattern, whose length measured along the Y-axis is not less than a predetermined value and whose width measured along the X-axis is not more than a predetermined value, are determined. For line ends adjacent to each other along the Y-axis, portions between the line ends, which connect the line ends, are defined as joints. For a line end positioned at the end of an entire pattern, a portion extending from the line end is defined as a front edge portion. For example, as shown in FIG. 3B, in which a width direction of gate patterns 11 is defined as the X-axis direction and a longitudinal direction of the gate patterns 11 is defined as the Y-axis direction, the line ends of each of the gate patterns 11 are detected. For ends of gate patterns 11 which are adjacent to each other along the Y-axis, portions between the line ends are defined as joints 13. For an end of gate patterns 11 positioned at the end of entire pattern, a portion extending from the line end is defined as a front edge portion 12. Here, the length of the front edge portion 12 along the Y-axis is determined to be the same length as the joints 13.

Figure 3C:
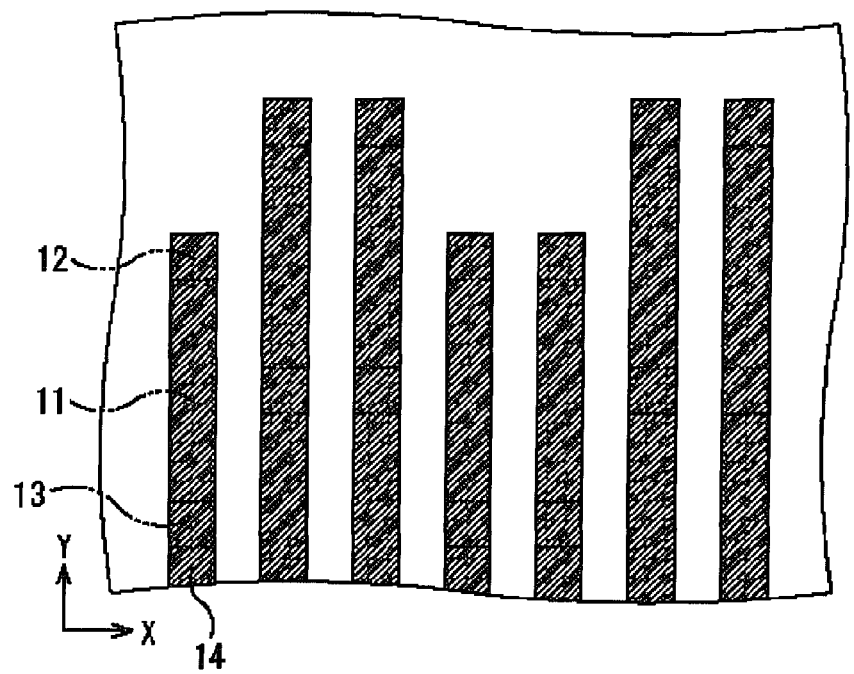
FIG. 3C is a schematic view showing a process of step of the first embodiment.

Then, object patterns, the front edge portions, and the joints, which are aligned on the same line extending along the Y-axis, are connected to form first reticle data (step S12). For example, as shown in FIG. 3C, gate patterns 11, front edge portions 12, and joints 13 are connected to form binding portions 14.

Figure 3D:
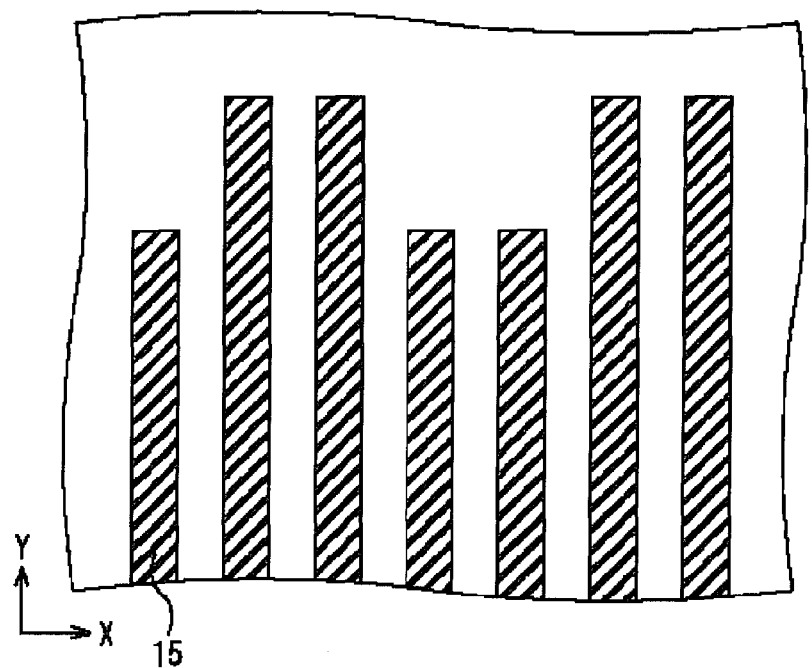
FIG. 3D is a schematic view showing a process of step of the first embodiment.

As described above, a reticle pattern having binding portions formed in step S12, which serve as light blocking portions, is formed (step S13). For example, as shown in FIG. 3D, a reticle pattern having the binding portions 14, which serve as light blocking patterns 15, is formed.

Figure 3E:
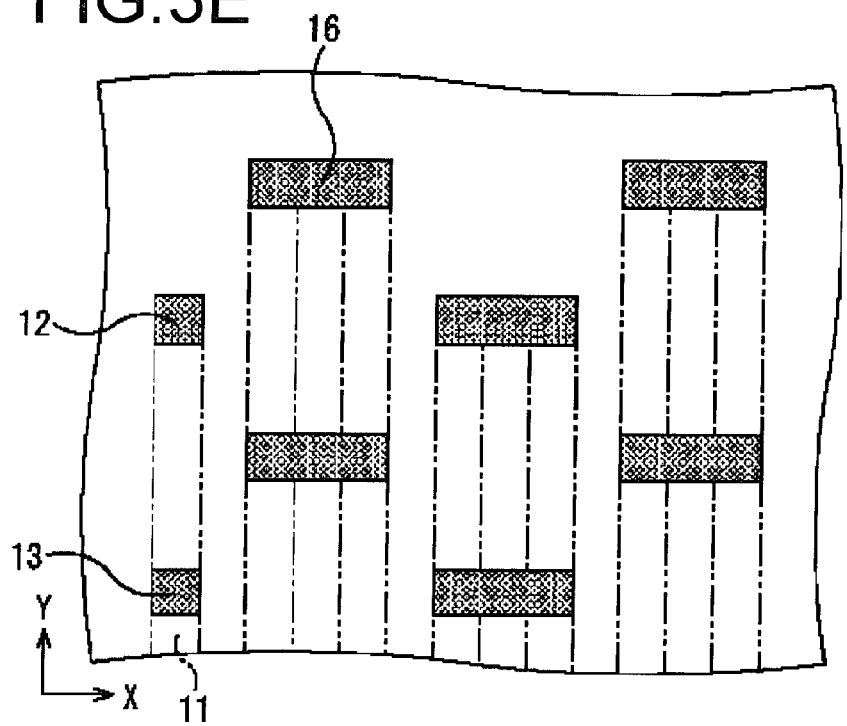
FIG. 3E is a schematic view showing a process of step of the first embodiment.

After step S11, the front edge portions, which are adjacent to each other and aligned on the same line extending along the X-axis, are connected and joints, which are adjacent to each other and aligned on the same line extending along the X-axis, are also connected to form second reticle data (step S14). For example, as shown in FIG. 3E, the front edge portions 12 of the gate patterns 11, which are adjacent to each other, are connected and the joints 13, which are adjacent to each other, are connected to form binding portions 16. When one of the front edge portions 12 and one of the joints 13 are adjacent to each other, these two portions are also connected. When the front edge portions 12 are not adjacent to each other or the joints 13 are not adjacent to each other, these portions are not connected.

Figure 3F:
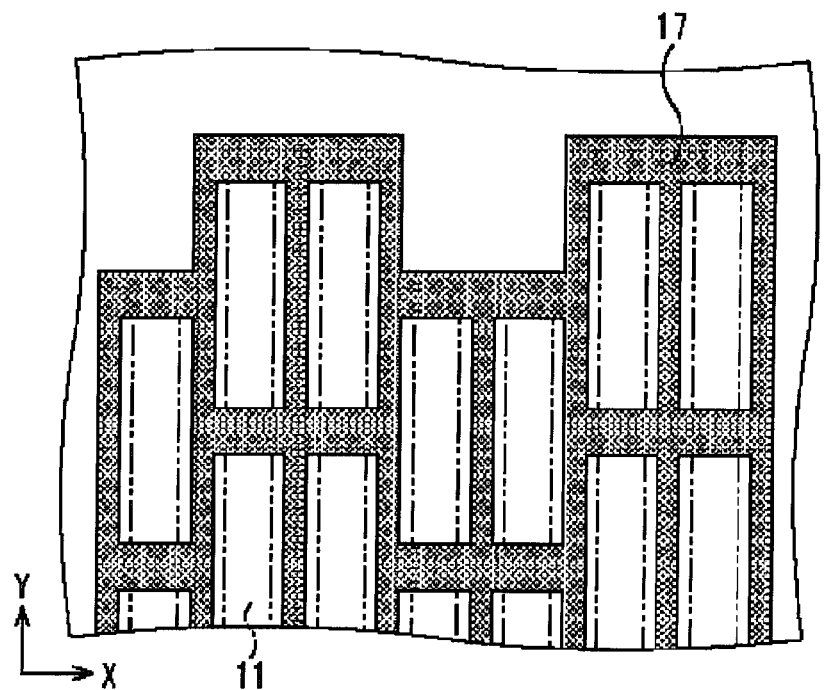
FIG. 3F is a schematic view showing a process of step of the first embodiment.

Then, by providing portions at central regions between the binding portions, which are adjacent to each other along the X-axis and extend along the Y-axis, the provided portions connect the adjacent binding portions including the front edge portions, the joints, and binding portions. Accordingly, the binding portions including the front edge portions, the joints and binding portions, which are aligned on the same line along the Y-axis, are bound into one body (step S15). That is, as shown in FIG. 3F, binding portions 17 are newly formed by connecting the binding portions 16, the front edge portions 12, and the joints 13. As a result, the front edge portions 12 and the joints 13 isolated from other portions disappear. That is, the front edge portions 12 or the joints 13 having areas which are smaller than the threshold value can be deleted from the data. Note that, the threshold value mentioned above is determined on the basis of optical conditions of exposure light, in which the second reticle for example, is used without causing defects in resolution. For example, the threshold value is equal to three times the size of a contact hole provided in a same reticle. When the binding portion 17 is formed, it is preferable that the binding portion 17 be positioned away from the gate patterns 11 in the X direction, that is, a gap is provided between the binding portion 17 and the gate patterns 11, so as to form a sufficient lithography margin therebetween.

Figure 3G:
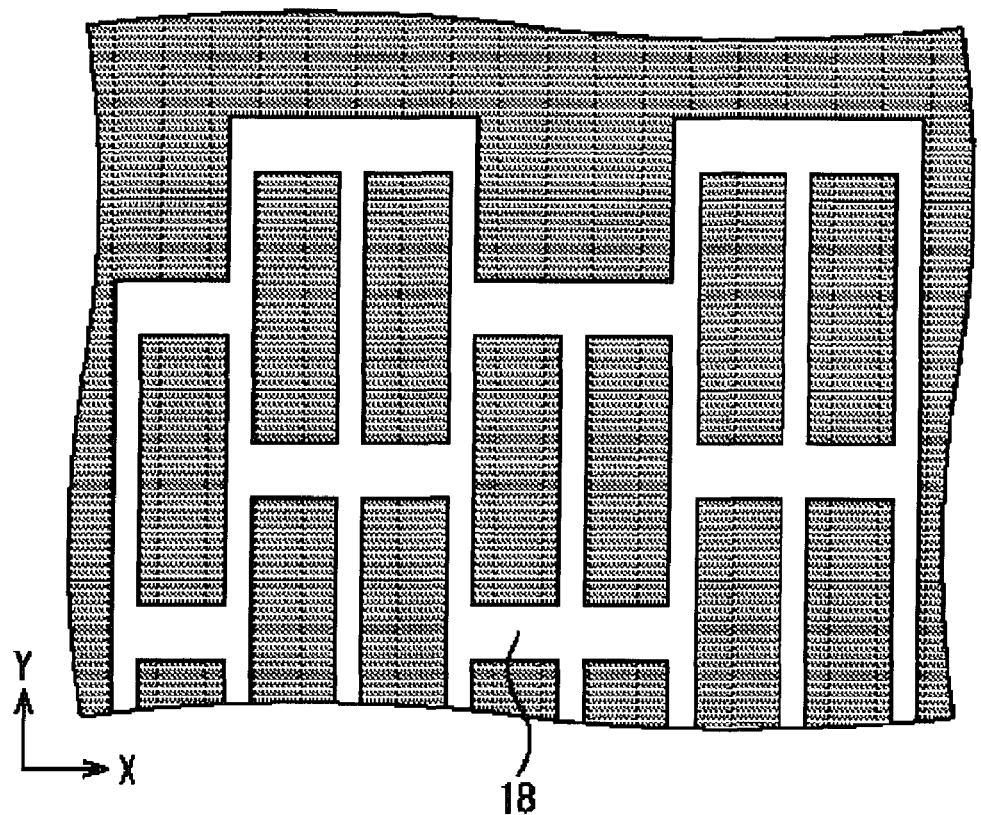
FIG. 3G is a schematic view showing a process of step of the first embodiment.

Then, reticle data having the binding portions obtained in step S15, which serve as transparent patterns of the reticle, is formed (step S16). For example, as shown in FIG. 3G, reticle data including data representing binding portions 17 serving as transparent patterns 18 is formed.

After steps S13 and S16, the layout data is checked in step S5.

Next, a method for manufacturing semiconductor devices using the reticles designed by the above-mentioned method will be described. FIGS. 4A to 4D are cross-sectional views of steps of forming a semiconductor device performed in this order.

Figure 4A:
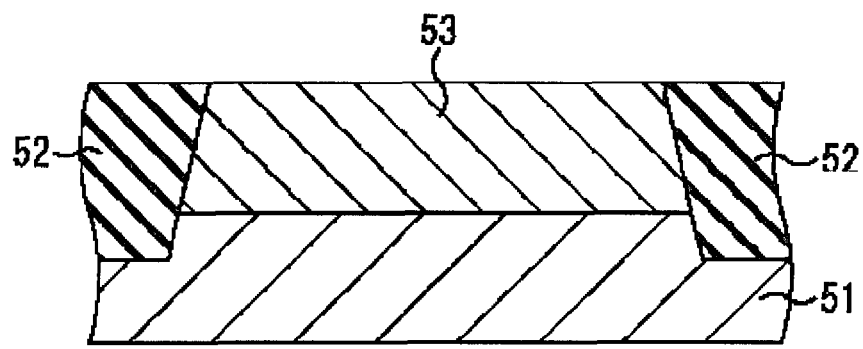
FIG. 4A is a cross-sectional view of a semiconductor device in a certain step of manufacturing thereof.

First, as shown in FIG. 4A, an isolation film 52 is formed by shallow trench isolation (STI) on a surface of a semiconductor substrate 51. Then, a well 53 is formed.

Figure 4B:
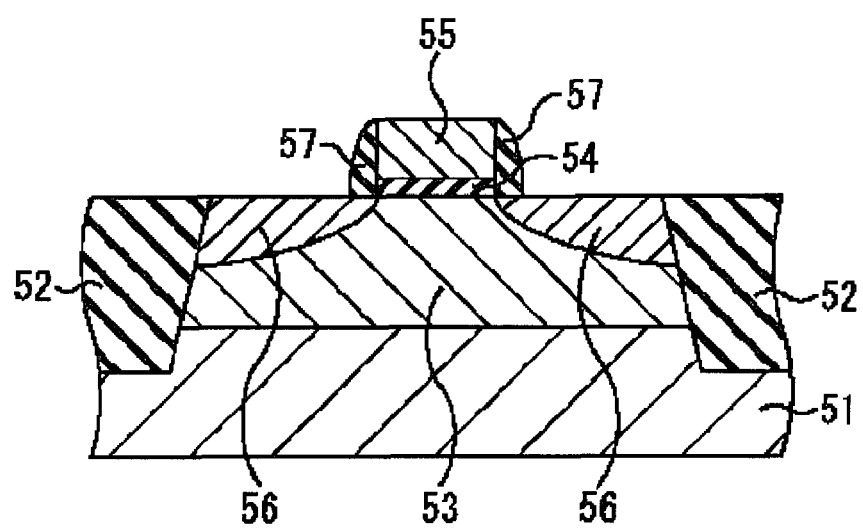
FIG. 4B is a cross-sectional view of a semiconductor device in a step following the step shown in FIG. 4A.

As shown in FIG. 4B, gate insulating films 54 and gate electrodes 55 are formed in this order using the above-mentioned reticle. Here, the method for forming the gate insulating films 54 and the gate electrodes 55 will be described. FIGS. 5A to 5G are schematic perspective views of a semiconductor device, which show steps of manufacturing the gate insulating films 54 and the gate electrodes 55 performed in this order. The isolation films 52 and the wells 53 are omitted in the drawings.

Figure 5A:
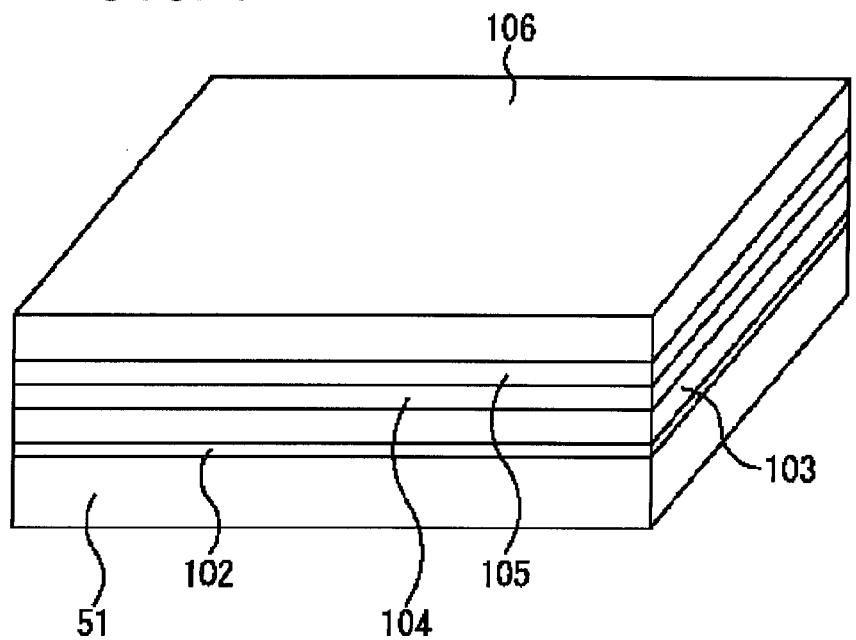
FIG. 5A is a schematic perspective view of a semiconductor device in a certain step of manufacturing gate electrodes on gate insulating films.

As shown in FIG. 5A, an insulating film 102 is formed by thermal oxidation or the like on the semiconductor substrate 51. Then, a conductive film 103 such as a polycrystalline silicon film is formed on the insulating film. Next, a hard mask 104 is formed on the conductive film 103, and then, an antireflective film 105 and a positive-type photoresist film 106 sensitive to ArF light are formed on the hard mask 104.

Figure 5B:
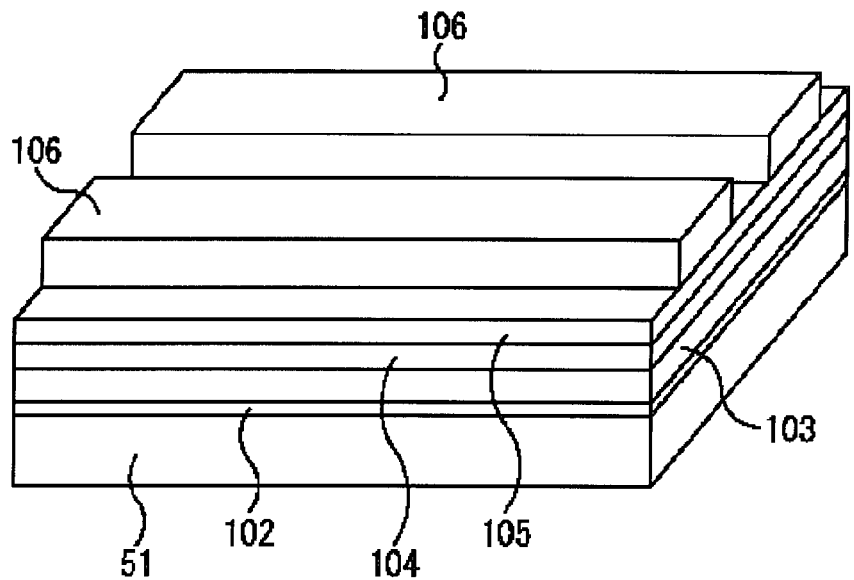
FIG. 5B is a schematic perspective view of gate electrodes on gate insulating films in a step following the step shown in FIG. 5A.

By using the first reticle, which was formed on the basis of the data shown in FIG. 3D, the photoresist film 106 is exposed to light and developed. As a result, as shown in FIG. 5B, the first reticle pattern is transferred to the photoresist film 106.

Figure 5C:
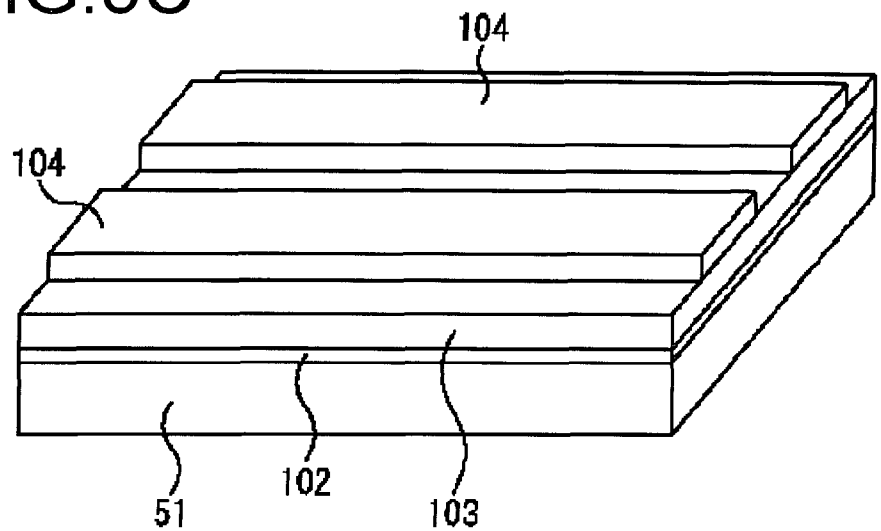
FIG. 5C is a schematic perspective view of gate electrodes on gate insulating films in a step following the step shown in FIG. 5B.

Then, the antireflective film 105 and the hard mask 104 are etched using the photoresist film 106 as a mask. Then, the photoresist film 106 and the antireflective film 105 are removed. After these steps, as shown in FIG. 5C, the resulting hard mask 104 is left on the conductive film 103.

Figure 5D:
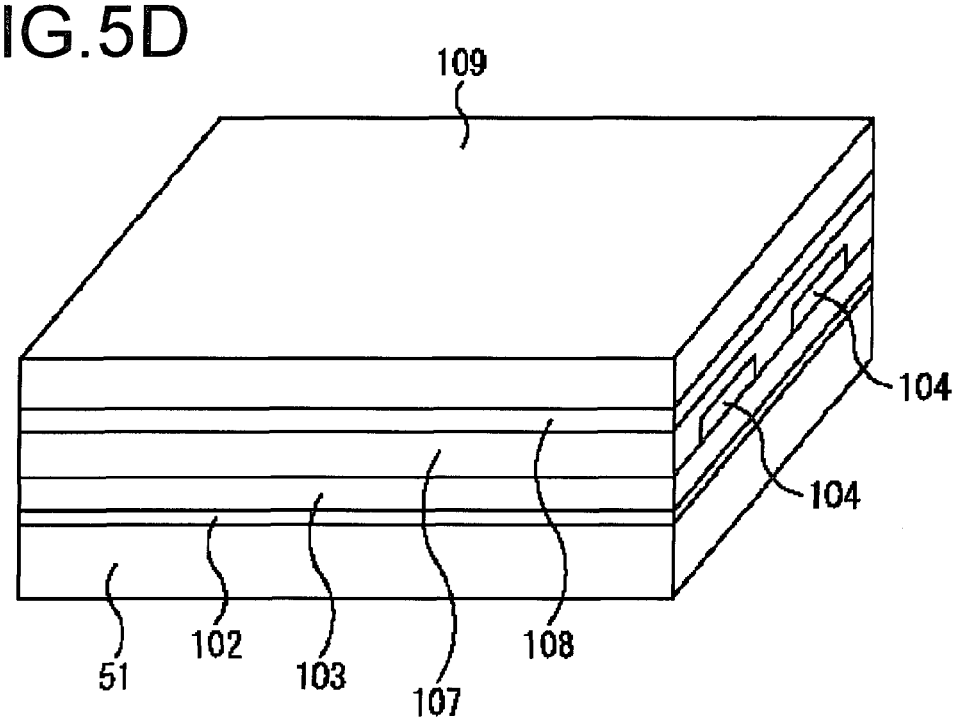
FIG. 5D is a schematic perspective view of gate electrodes on gate insulating films in a step following the step shown in FIG. 5C.
Figure 5G:
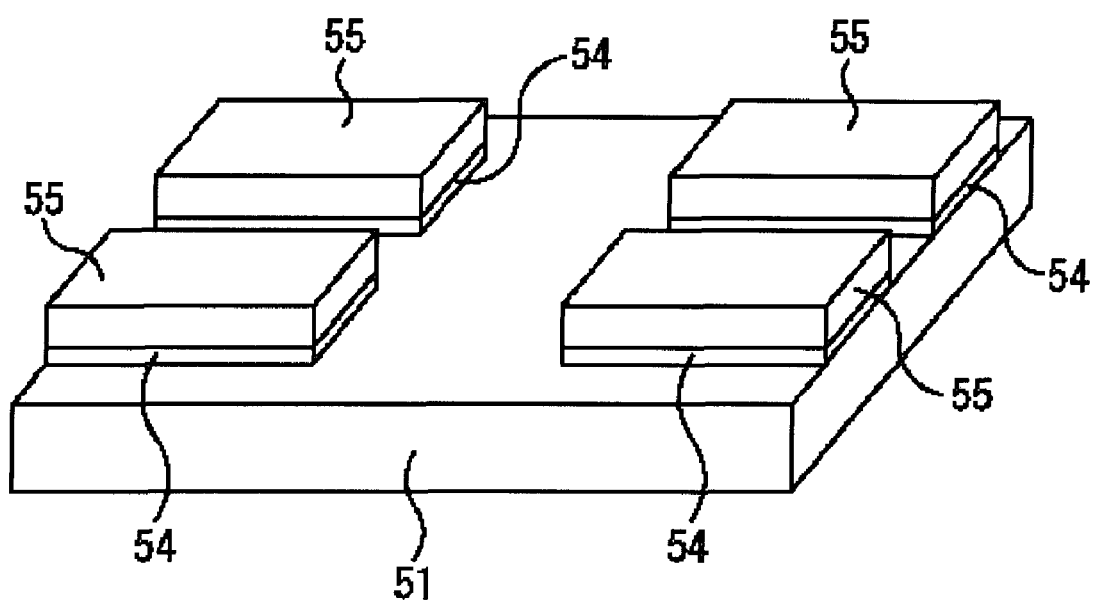
FIG. 5G is a schematic perspective view of gate electrodes on gate insulating films in a step following the step shown in FIG. 5F.

As shown in FIG. 5D, a layer 107 that flattens concave portions formed between portions of the hard mask 104 is formed on the conductive film 103 and an antireflective film 108 and a positive-type photoresist film 109 sensitive to ArF light are formed on the layer 107.

Then, by using the second reticle, which was formed on the basis of the data shown in FIG. 3F, the photoresist film 109 is exposed to light and developed. As a result, as shown in FIG. 5E, the second reticle pattern is transferred to the photoresist film 109. It is not always necessary to change the optical conditions, in which the photoresist film 106 was exposed, when the photoresist film 109 is exposed.

Next, the antireflective film 108 and the hard mask 104 are etched using the photoresist film 109 as a mask. The photoresist film 109 and the resulting antireflective film 108 are removed. After these steps, as shown in FIG. 5F, the resulting hard mask 104 is left on the conductive film 103 as a result of performance of the two different patterning steps.

Then, the conductive film 103 and the insulating film 102 are etched using the hard mask 104 so as to form the gate electrodes 55 and the gate insulating films 54. The hard mask 104 is removed.

After the formation of the gate insulating films 54 and the gate electrodes 55, as shown in FIG. 4B, an impurity diffusion layer 56 and a sidewall insulating film 57 are formed. Through such steps mentioned above, field effect transistors are formed.

Figure 4C:
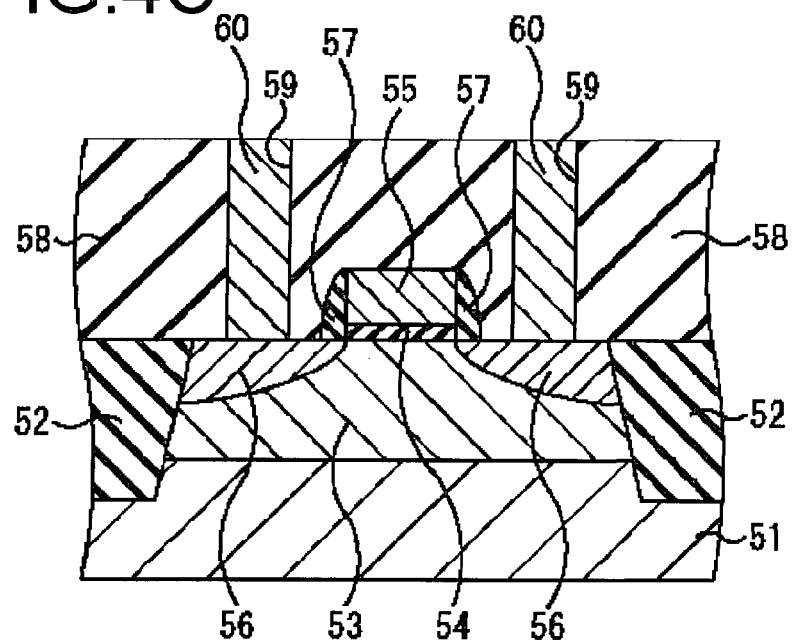
FIG. 4C is a cross-sectional view of a semiconductor device in a step following the step shown in FIG. 4B.

As shown in FIG. 4C, an interlayer insulating film 58 covering the field effect transistors is formed and contact holes 59 reaching the impurity diffusion layer 56 are formed. Contact plugs 60 are formed in the contact holes 59.

Figure 4D:
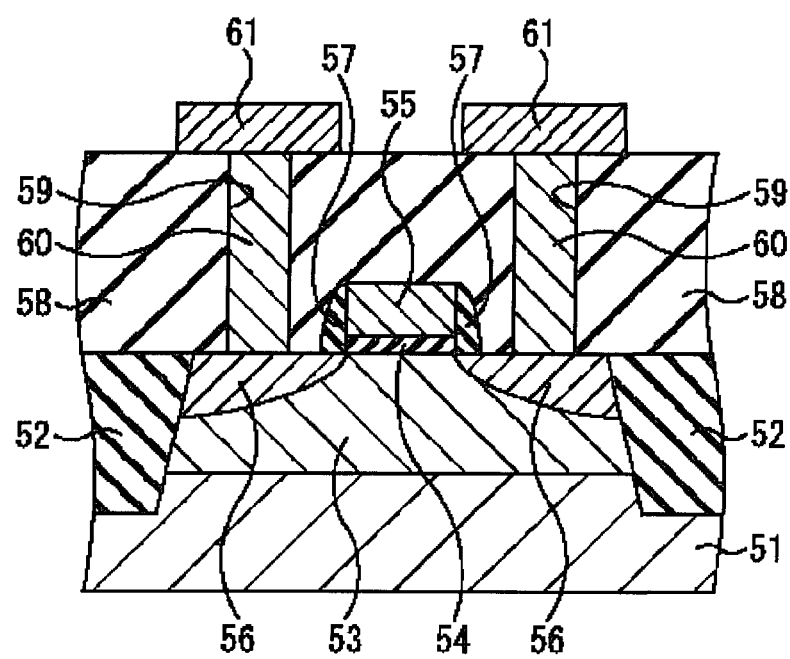
FIG. 4D is a cross-sectional view of a semiconductor device in a step following the step shown in FIG. 4C.

As shown in FIG. 4D, wiring layers 61 connecting the contact plugs 60 are formed on the interlayer insulating film 58.

Finally, wiring layers, plugs, interlayer insulating films, and the like are formed to complete the formation of the semiconductor device.

According to the method described above, since the areas of the transparent patterns 18 in the second reticle become large, defects in resolution can be reduced due to existence of a sufficient lithography margin during exposure. If the method disclosed in Japanese Laid-open Patent Publication No. 2004-103999 is applied, the transparent patterns, which are formed on a reticle that is used in a second exposing step to separate a conductive film, become isolated from other patterns and the areas of the transparent patterns become smaller, which leads to occurrence of defects in resolution. In contrast to this, according to the present embodiment, as mentioned above, since areas of the transparent patterns 18 become large, occurrence of defects in resolution can be prevented. Therefore, even if a resolution of an aligner is insufficient, semiconductor devices can be manufactured according to the design with high accuracy if this method is applied. Therefore, by narrowing a width of transparent patterns 18 on the second reticle, the area of a memory cell such as a cell of a SRAM, can be reduced because the distance between the gate electrodes can be reduced. In such a case, memory density of SRAM and the like can be improved. Furthermore, since there is no difference between the optical conditions of the two exposing steps, an operation is simple compared with existing methods and a throughput of an apparatus used in the operation can be increased.

Figure 6:
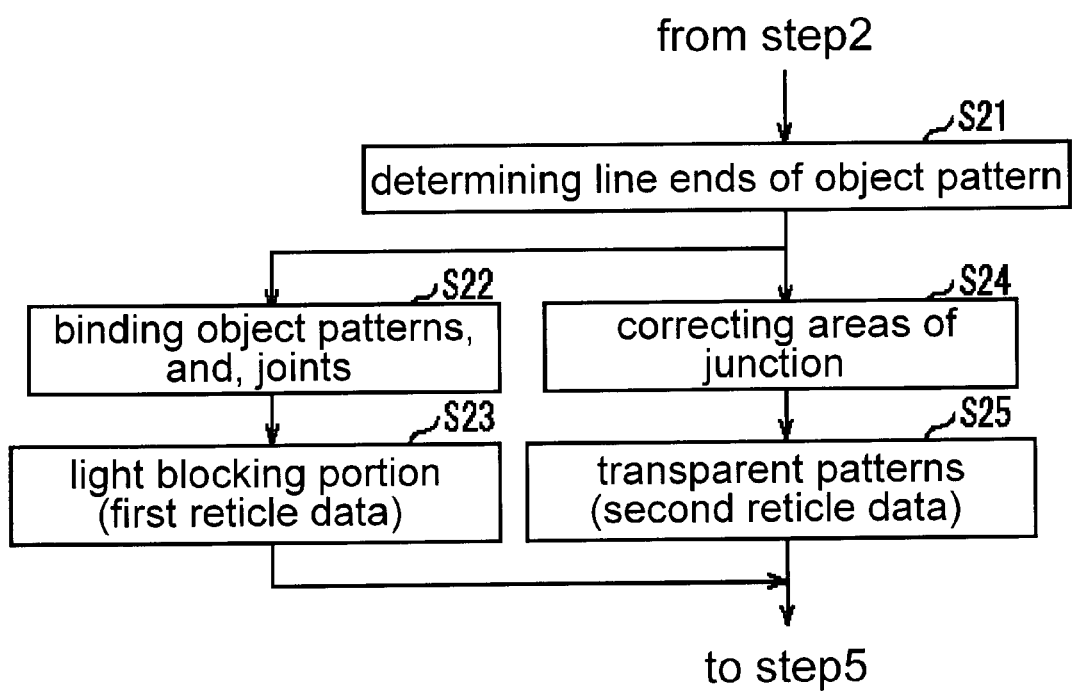
FIG. 6 is a flowchart showing a process performed in step S4 of a second embodiment.
Figure 7A:
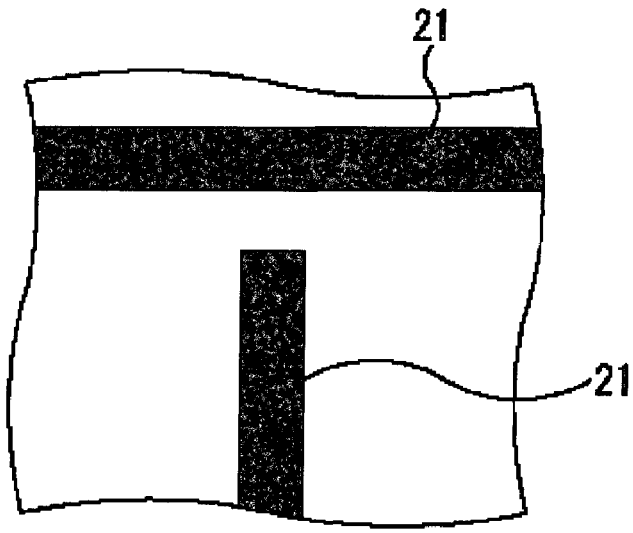
FIG. 7A is a schematic view of layout data used in the second embodiment.

A second embodiment of the present invention will now be described. The present embodiment facilitates of manufacturing a semiconductor device, such as a logic circuit, which does not include a high number of repeated patterns. The first embodiment and the second embodiment differ in terms of a process performed in step S4. FIG. 6 is a flowchart showing a process performed in step S4 of the present embodiment. Here, the present embodiment is described assuming that the layout data obtained in step S1 includes a pattern shown in FIG. 7A. This pattern has a first gate pattern 21 extending in a direction and a second gate pattern 21 facing the side of the first gate pattern 21 with a predetermined gap therebetween.

Figure 7B:
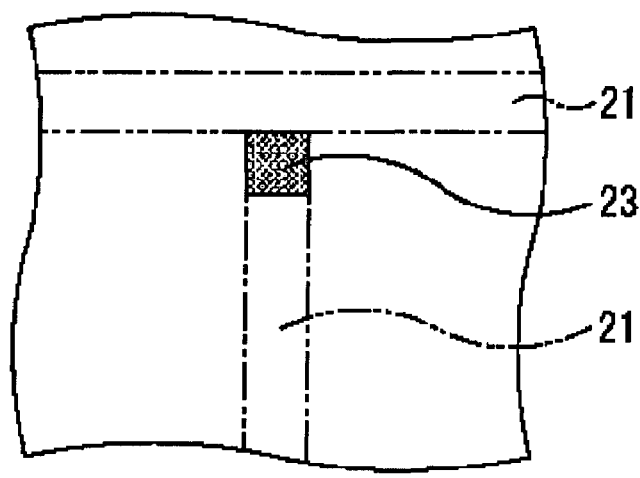
FIG. 7B is a schematic view showing a process of step S21 of the second embodiment.

With reference to the layout data obtained in step S1, a junction in the pattern is determined (step S21). First, two lines, which extend in respective directions and cross each other at angles in a plane in which the object pattern is to be formed, are determined. Next, as shown in FIG. 7B, when a distance between an end of one of the lines and the other line is equal to or smaller than a predetermined value, a portion between the line end and the other line is defined as a junction 23.

Figure 7C:
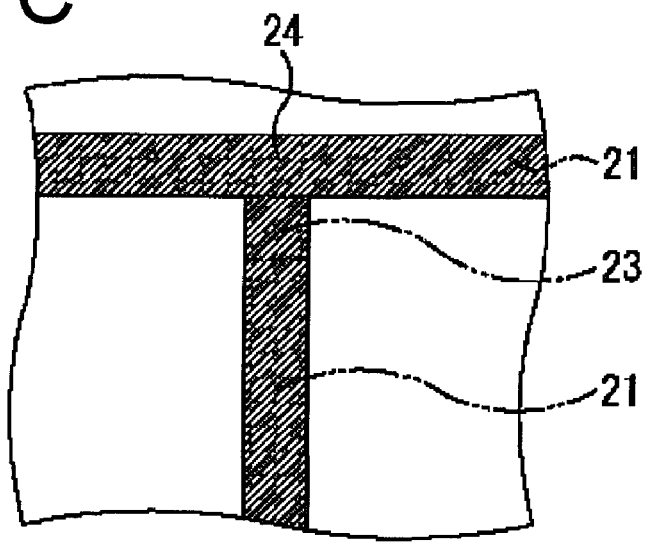
FIG. 7C is a schematic view showing a process of step S22 of the second embodiment.

Then, the two lines of the object patterns are connected to junction 23 to form first reticle data (step S22). For example, as shown in FIG. 7C, gate patterns 21 and the junction 23 are connected to form binding portions 24.

Figure 7D:
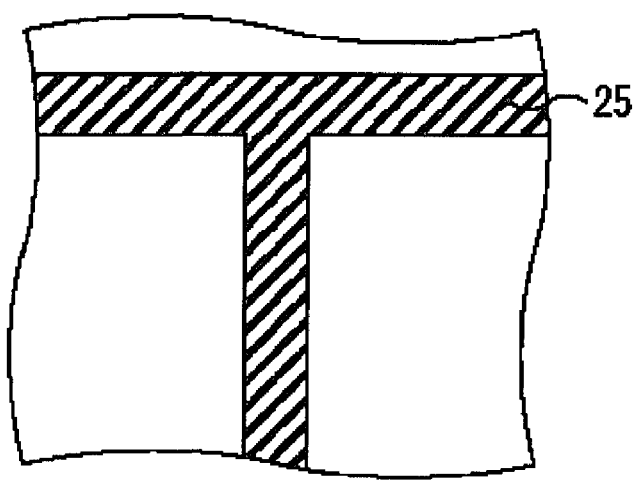
FIG. 7D is a schematic view showing a process of step S23 of the second embodiment.

As described above, a reticle pattern having binding portions formed in step S22, which serve as light blocking portions, is formed (step S23). For example, as shown in FIG. 7D, a reticle pattern having the binding portions 24 serving as light blocking patterns 25 is formed.

Figure 7E:
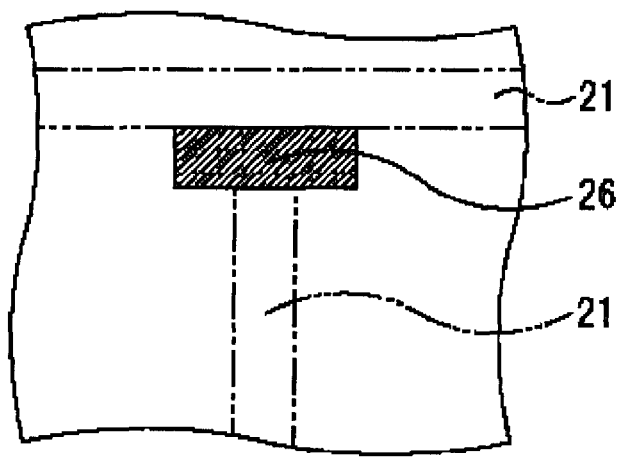
FIG. 7E is a schematic view showing a process of step S24 of the second embodiment.

After step S21, in order to form the second reticle data, areas of junctions are corrected (step S24). In this correction, the junctions are enlarged so as to be not smaller than the threshold value without overlapping the object patterns. For example, as shown in FIG. 7E, the junction 23 may be enlarged to be a corrected junction 26 which is elongated in a direction parallel to the corresponding gate pattern 21.

Figure 7F:
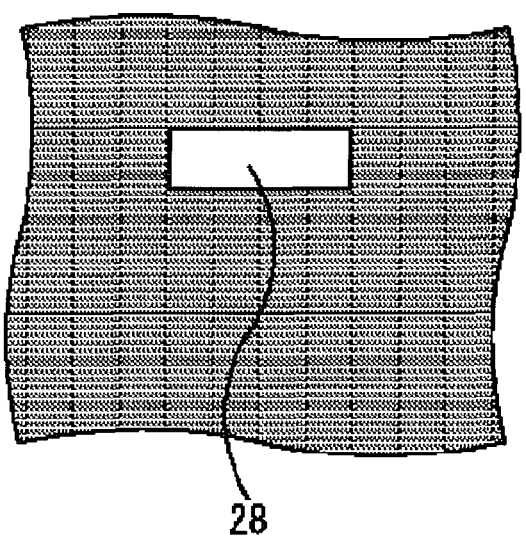
FIG. 7F is a schematic view showing a process of step S25 of the second embodiment.

As described above, a reticle pattern having corrected junctions obtained in step S24, which serves as transparent patterns in the reticle, are formed (step S25). For example, as shown in FIG. 7F, a reticle pattern having the corrected junction 26 serving as a transparent pattern 28 is formed.

After steps S23 and S25, the layout data is checked in step S5.

Structures other than the above-mentioned structure are the same as those described in the first embodiment.

According to the second embodiment, a semiconductor device such as a logic circuit whose patterns are relatively random can be manufactured on the basis of the layout data with high accuracy.

Note that the first embodiment can be applied to the manufacturing method in combination with the second embodiment. For example, in the second embodiment, junctions may be connected to each other to form a single junction whose area is equal to or larger than the predetermined threshold value.

The type of reticle is not limited. Examples of the reticle include a halftone reticle, a chrome reticle, and a Levenson-type reticle.

In the first and the second embodiments, the first reticle and the second reticle can be used in any order. For example, a patterning step using the photoresist film 106 as a mask may be performed after a patterning step using the photoresist film 109 as a mask.

The embodiments of can be realized with a computer. Means for providing a program to the computer, for example, a CD-ROM storing the above-mentioned program as a recording medium and the internet as a transmitting medium with which the above-mentioned program is transmitted may also be included within the scope of the embodiment. Furthermore, a program for printing the above-mentioned reticle patterns may also be included within the scope of the embodiments. That is, the above-mentioned program, the recording medium, the transmitting medium, and the program products are included within the scope of the present invention.

Aspects of the present invention will be described below as appendices.

What is claimed is:

1. A method for manufacturing a semiconductor device comprising:
    forming a mask layer over a target film;
    forming a first photoresist film over the mask layer;
    patterning the first photoresist film using a first photomask;
    patterning the mask layer using the first photoresist film as a mask;
    removing the first photoresist film;
    forming a second photoresist film over the mask layer;
    patterning the second photoresist film using a second photomask;
    patterning the mask layer using the second photoresist film as a mask;
    removing the second photoresist film; and
    patterning the target film using the mask layer, wherein the first photomask has a binding pattern binding at least two target patterns, which are retained separate from each other with respect to layout data; and the second photomask has a separation pattern overlapping the binding pattern and separating the target patterns formed in one body in the first photomask, wherein an area of the separation pattern is equal to or larger than a predetermined threshold value.

2. The method for manufacturing a semiconductor device according to claim 1, wherein a positive-type photoresist film is used as the first photoresist film and the second photoresist film.

3. The method for manufacturing a semiconductor device according to claim 2, wherein the binding pattern is a light blocking pattern and the separation pattern is a transparent pattern.

4. The method for manufacturing a semiconductor device according to claim 1, wherein a hard mask is used as the mask layer.

5. The method for manufacturing a semiconductor device according to claim 1, wherein the patterning step of the second photoresist film includes:
    exposing the second photoresist film to light using the second photomask; and
    developing the second photoresist film, wherein the threshold value is determined on the basis of the optical conditions under which the second photoresist film is exposed.

6. The method for manufacturing a semiconductor device according to claim 1, wherein the separation pattern connects a plurality of binding patterns.

7. The method for manufacturing a semiconductor device according to claim 1, wherein
    the target patterns formed in one body in the first photomask extend in a first direction; and
    the separation pattern is positioned away from the target patterns in a second direction that crosses the first direction at right angles.

* * * * *